(12) United States Patent
Strang

(10) Patent No.: US 7,666,479 B2
(45) Date of Patent: Feb. 23, 2010

(54) APPARATUS AND METHOD OF GAS INJECTION SEQUENCING

(75) Inventor: Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/746,779

(22) Filed: May 10, 2007

(65) Prior Publication Data
US 2007/0204907 A1 Sep. 6, 2007

Related U.S. Application Data

(62) Division of application No. 10/157,180, filed on May 30, 2002, now abandoned.

(60) Provisional application No. 60/301,434, filed on Jun. 29, 2001.

(51) Int. Cl.
*C23C 16/455* (2006.01)
*C23C 16/52* (2006.01)
*C23F 1/00* (2006.01)
*H01L 21/306* (2006.01)
*H05H 1/24* (2006.01)
*C23C 16/06* (2006.01)
*C23C 16/22* (2006.01)

(52) U.S. Cl. .................. 427/569; 118/663; 118/689; 118/690; 118/692; 118/666; 156/345.15

(58) Field of Classification Search .............. 118/666, 118/663, 689, 690, 692; 156/345.15; 427/569
See application file for complete search history.

(56) References Cited

U.S. PATENT DOCUMENTS

| | | | |
|---|---|---|---|
| 4,761,269 A * | 8/1988 | Conger et al. ............... 118/679 |
| 4,835,114 A * | 5/1989 | Satou et al. ................. 438/488 |
| 4,854,263 A | 8/1989 | Chang et al. |
| 5,091,207 A * | 2/1992 | Tanaka ............................ 427/8 |
| 5,200,388 A * | 4/1993 | Abe et al. ..................... 505/447 |
| 5,306,666 A * | 4/1994 | Izumi .......................... 438/680 |
| 5,423,936 A * | 6/1995 | Tomita et al. ........... 156/345.34 |
| 5,453,124 A * | 9/1995 | Moslehi et al. .............. 118/715 |
| 5,496,408 A * | 3/1996 | Motoda et al. .............. 118/715 |
| 5,500,256 A * | 3/1996 | Watabe ........................ 427/579 |
| 5,567,267 A * | 10/1996 | Kazama et al. ......... 156/345.27 |
| 5,616,208 A * | 4/1997 | Lee ......................... 156/345.24 |
| 5,683,517 A | 11/1997 | Shan |
| 5,685,912 A * | 11/1997 | Nishizaka .................... 118/719 |
| 5,769,950 A * | 6/1998 | Takasu et al. ................ 118/715 |

(Continued)

*Primary Examiner*—Rudy Zervigon
(74) *Attorney, Agent, or Firm*—Oblon, Spivak, McClelland, Maier & Neustadt, L.L.P.

(57) ABSTRACT

An apparatus and method for gas injection sequencing in order to increase the gas injection total pressure while satisfying an upper limit to the process gas flow rate, thereby achieving gas flow uniformity during a sequence cycle and employing practical orifice configurations. The gas injection system includes a gas injection electrode having a plurality of regions, through which process gas flows into the process chamber. The gas injection system further includes a plurality of gas injection plenums, each independently coupled to one of the aforesaid regions and a plurality of gas valves having an inlet end and an outlet end, where the outlet end is independently coupled to one of the aforesaid plurality of gas injection plenums. The gas injection system includes a controller coupled to the plurality of gas valves for sequencing the flow of process gas through the aforesaid plurality of regions.

6 Claims, 6 Drawing Sheets

U.S. PATENT DOCUMENTS

| | | | |
|---|---|---|---|
| 5,853,484 A * | 12/1998 | Jeong | 118/715 |
| 5,888,907 A * | 3/1999 | Tomoyasu et al. | 438/714 |
| 5,976,261 A | 11/1999 | Moslehi et al. | |
| 6,162,323 A * | 12/2000 | Koshimizu | 156/345.26 |
| 6,202,653 B1 * | 3/2001 | Harada et al. | 134/22.11 |
| 6,432,831 B2 * | 8/2002 | Dhindsa et al. | 438/710 |
| 6,645,302 B2 * | 11/2003 | Udagawa | 118/715 |
| 7,338,901 B2 * | 3/2008 | Ishizaka | 438/680 |
| 7,491,430 B2 * | 2/2009 | Ishizaka et al. | 427/569 |
| 2004/0038525 A1 * | 2/2004 | Meng et al. | 438/656 |
| 2004/0224504 A1 * | 11/2004 | Gadgil | 438/680 |
| 2005/0039681 A1 * | 2/2005 | Fukiage | 118/723 E |
| 2006/0211246 A1 * | 9/2006 | Ishizaka et al. | 438/685 |

* cited by examiner

SONIC ORIFICE

DIVERGENT NOZZLE

"MINIMUM-LENGTH" NOZZLE

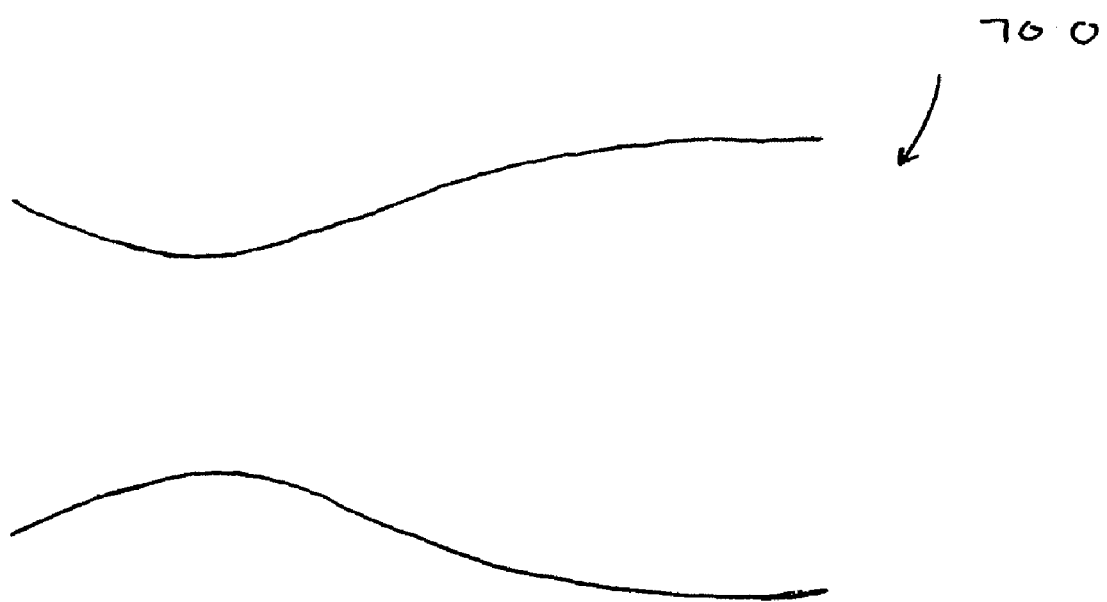
FIG. A

APPARATUS AND METHOD OF GAS INJECTION SEQUENCING

CROSS-REFERENCE TO RELATED APPLICATIONS

This application claims priority to U.S. Application Ser. No. 60/301,434 filed Jun. 29, 2001, and is related to U.S. Application Ser. No. 60/272,452, filed Mar. 2, 2001 entitled "SHOWER-HEAD GAS INJECTION APPARATUS WITH SECONDARY HIGH PRESSURE PULSED GAS INJECTION" and PCT International Application Serial No. PCT/US02/03405, filed Feb. 26, 2002 entitled "SHOWER-HEAD GAS INJECTION APPARATUS WITH SECONDARY HIGH PRESSURE PULSED GAS INJECTION". The contents of those applications are incorporated herein by reference.

BACKGROUND OF THE INVENTION

1. Field of the Invention

The present invention relates to plasma processing and more particularly to a system including a gas injection component for improved plasma processing.

2. Discussion of the Background

Typically, during materials processing, plasma is employed to facilitate the addition and removal of material films when fabricating composite material structures. For example, in semiconductor processing, a (dry) plasma etch process is utilized to remove or etch material along fine lines or within vias or contacts patterned on a silicon substrate. The plasma etch process generally involves positioning a semiconductor substrate with an overlying patterned, protective layer (for example, a photoresist layer) into a processing chamber. Once the substrate is positioned within the chamber, an ionizable, dissociative gas mixture is introduced within the chamber at a pre-specified flow rate, while a vacuum pump is throttled to achieve an ambient process pressure.

Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, any exposed surfaces of the substrate are etched by the plasma. The process is adjusted to achieve optimal conditions, including an appropriate concentration of desirable reactant and ion populations to etch various features (e.g., trenches, vias, contacts, etc.) in the exposed regions of the substrate. Such substrate materials where etching is required include silicon dioxide ($SiO_2$), poly-silicon and silicon nitride.

As the feature size shrinks and the number and complexity of the etch process steps used during integrated circuit (IC) fabrication escalate, the ability to control the transport of reactive materials to and effluent etch products from etch features becomes more stringent. The ability to control such processes must insure achievement of the proper chemical balance necessary to attain high etch rates with good material selectivity.

The etch rate in most dry etch applications (for example, oxide ($SiO_2$) etch applications) includes a physical component and a chemical component. The plasma chemistry should create a population of positively charged (for example, relatively heavy, singly charged argon ions) utilized as the physical component and a population of chemical radicals (such as atomic fluorine F, and CF, $CF_2$, $CF_3$ or more generally $CF_x$ species in a fluorocarbon plasma) utilized for the chemical component. Moreover, the chemical reactants ($CF_x$) act as reactants in the surface etch chemistry and the (heavy) positively charged ions ($Ar^+$) provide energy to catalyze the surface reactions.

As feature sizes progressively shrink, they do so at a rate greater than the shrinking oxide and other film thicknesses. Therefore, the etch feature aspect ratio (depth-to-width) is greatly increased with shrinking sizes, for example on the order 10:1. As the aspect ratio increases, the directionality of chemical reactant and ion transport local to the etch features becomes increasingly important in order to preserve the anisotropy of the etch feature.

The transport of electrically charged species such as ions can be affected by an electric force and, therefore, it is conventional in the industry to provide a substrate holder or chuck with an RF bias to attract and accelerate ions to the substrate surface through the plasma sheath such that they arrive moving in a direction substantially normal to the substrate surface. However, the transport of neutral, chemically reactive species is not amenable to the application of an electric force to assert their directionality at the substrate surface. In order to affect the same, gas species are injected under high pressure to preserve their directionality upon expanding into the low-pressure environment and the ambient pressure is sufficiently reduced to further maintain a narrow angular distribution of the velocity field near the substrate surface.

In order to affect changes in the transport of neutral species local to the substrate surface and, thus, affect the etch rate of high aspect ratio features, the gas injection total pressure can be increased. One way to increase the gas injection total pressure is to increase the mass flow rate of process gas into the process chamber. However, in order to achieve the same process pressure, the pumping speed to the processing region must be proportionately increased. For example, when utilizing a shower-head gas injection system including approximately three-hundred-and-sixty 0.5 mm diameter orifices of 1 cm in length with a typical process gas flow rate, for example, of 400 sccm (standard cubic centimeters per minute) argon, the gas injection total pressure can be approximately 6 Torr. In order to increase the gas injection total pressure by a factor of ten (e.g., from 6 to 60 Torr), the mass flow rate must be increased by a factor of ten (e.g., from 400 to 4000 sccm argon) and, therefore to achieve the same process pressure of, for example, 20 mTorr, the pumping speed at the processing region must also be increased by a factor of ten (e.g., from 250 to 2500 liters per second).

A turbo-molecular pump (TMP) with a minimum inlet pumping speed of 5000 liters per second is employed to achieve this demand for pumping speed. The TMP includes a vacuum chamber configured to have at least a flow conductance equivalent to that of the inlet pumping speed to the TMP. However, these high-speed pumps are cumbersome, and extremely expensive (e.g., currently such pumps cost approximately $100,000 per pump with an additional $50,000 for an appropriately sized gate valve). Moreover, to accommodate their size and enable the aforesaid flow conductance, the process chamber footprint must be increased. Consequently, they are not an economically viable solution. Therefore, what is needed is a way to substantially increase the gas injection total pressure while satisfying an upper limit to the process gas flow rate.

Another technique is to pulse the gas in short bursts as it enters the process chamber. However, this technique results in transient pressure waves due to the large volume of gas introduced to the chamber with each pulse. In particular, there is an abrupt increase in chamber pressure followed by a slow decay as the vacuum pump struggles to bring the pressure back to specification. What is needed is a way to increase the gas injection total pressure without creating a substantially non-stationary process.

A further method of increasing the gas injection total pressure, while not affecting the mass flow rate or process chamber pressure, involves reducing the number and/or size of the gas injection orifices (i.e. reducing the total injection flow-through area). However, this reduction can seriously jeopardize process uniformity over large substrates, for example, 200 to 300 mm and greater. Conventional systems achieve uniform etching of substrates by maintaining a uniform gas flow over the substrate surface (in addition to other requirements). In order to achieve a uniform introduction of the process gas to the process environment, materials processing devices utilize a showerhead gas distribution system comprising a plurality of gas orifices, for example, on the order 100 to 1000 gas injection orifices of 0.5 mm in diameter. However, to maintain conventional process recipes (i.e. chamber pressure and gas flow rate) optimal for etch applications such as oxide etch applications, the injection pressure is limited and neutral flow directionality suitable for high aspect ratio feature etch is sacrificed. What is needed is a way to increase the gas injection total pressure while achieving specifications for process uniformity and employing practical gas injection orifice geometry.

SUMMARY OF THE INVENTION

The present invention utilizes a gas injection system that overcomes the aforementioned problems for processing a workpiece in a plasma processing chamber.

According to an embodiment of the present invention, the gas injection system advantageously includes a gas injection electrode having a plurality of regions, through which process gas flows into the process chamber, wherein each region includes one or more gas injection orifices. The gas injection system further includes a plurality of gas injection plenums, each independently connected to one of the above regions of the gas injection electrode and a plurality of gas valves having an inlet end and an outlet end, wherein the outlet end is independently connected to one of the plurality of gas injection plenums of the gas injection system. The gas injection system further includes a controller coupled to the plurality of gas valves for sequencing the flow of process gas through the plurality of regions of the gas injection system.

Furthermore, an additional embodiment of the present invention advantageously provides a method for cyclically supplying at least one gas through at least two regions of the gas injection system to a plasma processing device for processing a substrate. The method includes the steps of (i) injecting a first gas in a first region of the gas injection system for a first period of time, (ii) injecting a second gas in a second region of the gas injection system for a second period of time, and (iii) performing steps (i) and (ii) for a third period of time, wherein the gas flow rate above the substrate is kept substantially constant during the third period of time.

The flow of process gas to the process chamber can additionally include the steady flow of a third gas in a third region of the gas injection system for the third period of time.

Furthermore, the gas injection sequencing can further include the overlapping of gas sequences to different regions within the gas injection system in order to allow for modulation of the chamber pressure.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 7 and FIG. 7A are each a cross-sectional view of an individual gas injection orifice, illustrating a third and fourth geometry respectively.

DETAILED DESCRIPTION OF THE INVENTION

Figure 1:
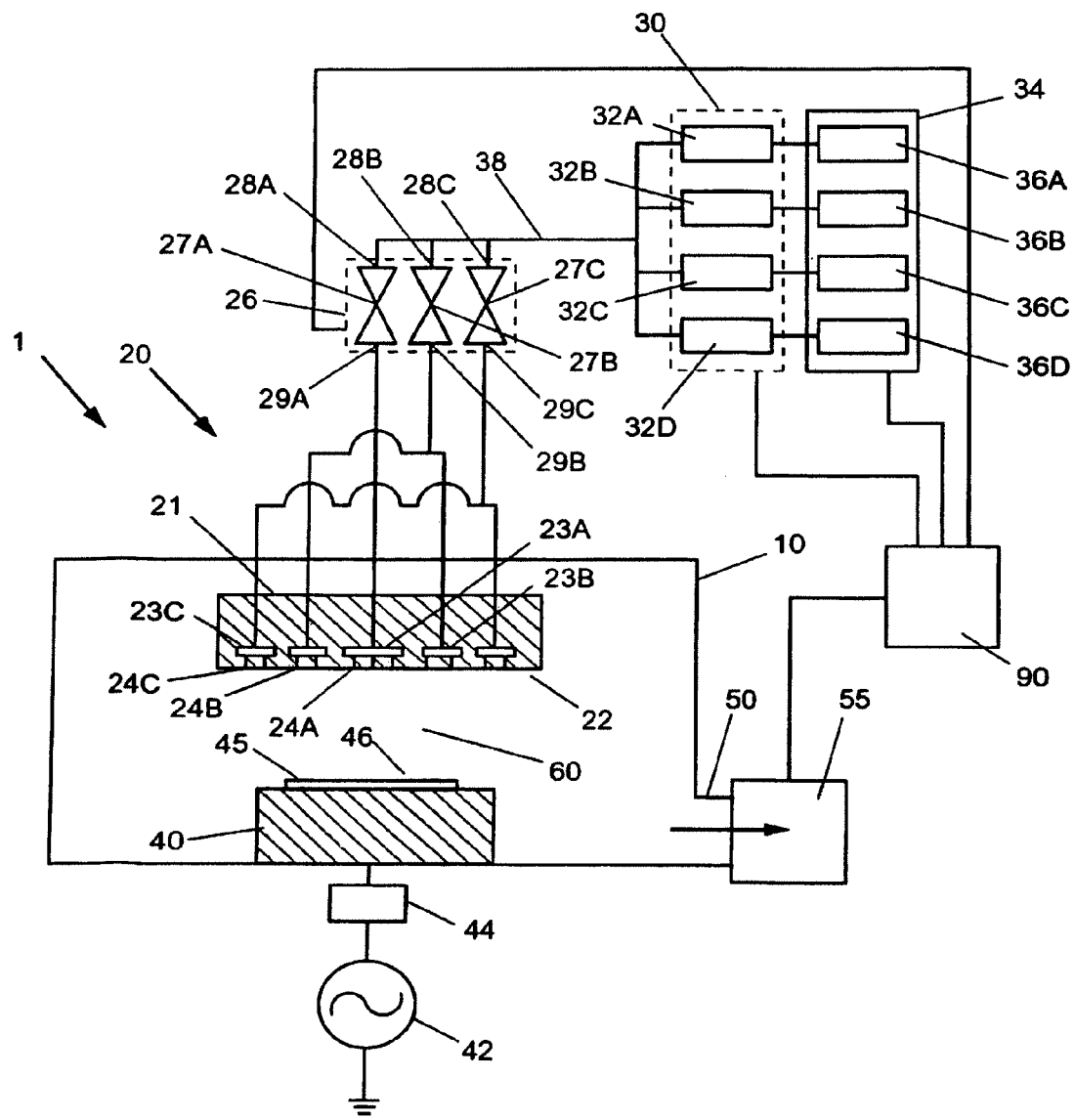
FIG. 1 is a schematic view of a plasma processing device with a gas injection system according to a first embodiment of the present invention.

A plasma processing device 1 is depicted in FIG. 1 including chamber 10, gas injection system 20, substrate holder 40 upon which a substrate 45 to be processed is affixed, pumping duct 50, and vacuum pumping system 55. Chamber 10 is configured to facilitate the generation of plasma 60 adjacent a surface of substrate 45, wherein plasma 60 is formed via collisions between heated electrons and an ionizable gas. An ionizable gas or mixture of gases is introduced via gas injection system 20 and the process pressure is adjusted using a gate valve (not shown) to throttle the vacuum pumping system 55. For example, plasma 60 is utilized to create materials specific to a pre-determined materials process, and to aid either the deposition of material to a substrate 45 or the removal of material from the exposed surfaces of substrate 45.

Substrate 45 is transferred into and out of chamber 10 through a slot valve (not shown) and chamber feed-through (not shown) via robotic substrate transfer system where it is received by substrate lift pins (not shown) housed within chuck 40 and mechanically translated by devices housed therein. Once substrate 45 is received from substrate transfer system, it is lowered to an upper surface of chuck 40 and affixed to chuck 40 via an electrostatic clamp (not shown). Moreover, gas may be delivered to the back-side of the substrate to improve the gas-gap thermal conductance between the substrate 45 and the chuck 40.

In an alternate embodiment, the chuck 40 can further include a cooling system including a re-circulating coolant flow that receives heat from chuck 40 and transfers heat to a heat exchanger system (not shown), or when heating, transfers heat from the heat exchanger system. Such a system can be utilized when temperature control of the substrate is required at elevated or reduced temperatures. For example, temperature control of the substrate may be useful at temperatures in excess of the steady-state temperature achieved due to a balance of the heat flux delivered to the substrate from the plasma and the heat flux removed from substrate by conduction to the chuck 40. In other embodiments, heating elements, such as resistive heating elements, can be included.

In a preferred embodiment, plasma 60 is utilized to process substrate 45. For example, chuck 40 is electrically biased at a RF voltage via the transmission of RF power from RF generator 42 through impedance match network 44 to chuck 40. The RF bias can serve to heat electrons and, thereby, capacitively couple power to plasma 60. In this configuration, it can operate as a reactive ion etch (RIE) reactor, wherein the chamber and upper gas injection electrode serve as ground surfaces. A typical frequency for the RF bias is 13.56 MHz. In another example, chuck electrode 40 can serve to bias the substrate 45 to control the ion energy during processing steps, wherein an additional electrode (e.g., inductive coil or electrode opposite the substrate) serves to generate a high density plasma (HDP).

The process gas is introduced to the plasma reactor via gas injection system 20 including gas injection electrode 21, gas valve manifold 26, mass flow controller manifold 30, and a gas supply 34. Process gas originates from the gas supply 34. Preferably, the gas supply 34 is a cabinet that houses a plurality of compressed gas cylinders, each of which stores a gas. The gas supply 34 preferably further includes pressure regulators for safe gas handling practices known to those of ordinary skill in the art. The gas supply 34 is also coupled to a controller 90.

The mass flow controller manifold 30 is coupled to the gas supply 34. The mass flow controller manifold 30 includes a plurality of mass flow controllers 32A, 32B, 32C, 32D. In a preferred embodiment, each mass flow controller 32A, 32B, 32C, 32D monitors and controls the mass flow rate of a single processing gas being supplied by gas supply 34. For example, four processing gases can be used. In an oxide etch process (e.g., a $SiO_2$ etch process), processing gases include Ar, $C_4F_8$ and $O_2$, wherein a fourth gas nitrogen ($N_2$) is available for chamber purging. An exemplary process recipe is a gas composition with flow rates $Ar/C_4F_8/O_2$=400/7/12 sccm (standard cubic centimeters per minute). Although provisions in FIG. 1 are made for four gases, either more than four gases or less than four gases can be used in alternate embodiments. Other gases can include $C_5F_8$, $C_4F_6$, HF, $NH_3$, $H_2$, $Cl_2$, $SF_6$, HBr, CO, etc. The gate valve located adjacent vacuum pump 55 in pumping duct 50 can be partially open in order to adjust the chamber process pressure to approximately 20 mTorr.

The mass flow controller manifold 30 is coupled to the controller 90. In a preferred embodiment, each mass flow controller 32A, 32B, 32C, 32D is coupled to the controller 90. The mass flow controllers 32A, 32B, 32C, 32D are preferably commercially available mass flow controllers capable of regulating the flow rate of gas ranging from 1 sccm to 2000 sccm (the mass flow controller is calibrated per the process specifications as discussed above). For example, 500 sccm, 40 sccm and 20 sccm mass flow controllers would be suitable for the above gas composition and flow rates, respectively.

The valve manifold 26 is coupled to mass flow controller manifold 30 via gas pipe 38. In a preferred embodiment, processing gases are mixed along the length of gas pipe 38. The valve manifold 26 includes gas inlets 28A 28B, 28C, a number of control valves 27A, 27B, 27C, and a number of outlet manifolds 29A, 29Bb, 29C. In a preferred embodiment, each gas inlet 28A, 28B, 28C is coupled to the gas pipe 38 and to a respective control valve 27A, 27B, 27Cc. In addition, each control valve 27A, 27B, 27C is coupled to a respective outlet manifold 29A, 29B, 29C. In a preferred embodiment, the valves 27A, 27B, 27C are each electrically actuated two-way valves. An exemplary valve is a pneumatically-activated valve such as a Nupro SS-BNVCR4-C valve. Moreover, the pneumatically-activated valves are opened and closed via activation from an array of electromechanical valves (e.g., SMC VQ-110U-5F).

The valve manifold 26 is coupled to the gas injection electrode 21, which includes a number of gas injection plenums 23A, 23B, 23C. In a preferred embodiment, each outlet manifold 29A, 29B, 29C is coupled to at least one gas injection plenum. In the embodiment depicted in FIG. 1, outlet manifold 29A is coupled to gas injection plenum 23A, outlet manifold 29B is coupled to gas injection plenum 23B, and outlet manifold 29C is coupled to gas injection plenum 23C. The valve manifold 26 is also coupled to the controller 90.

In a preferred embodiment, a first gas injection plenum 23A is a cylindrical volume, a second gas injection plenum 23B is an annular (ring-like) volume, and a third gas injection plenum 23C is an annular (ring-like) volume. Each gas injection plenum 23A, 23B, 23C is independently connected to a region of gas injection orifices 24A, 24B, 24C, respectively. For example, in a gas injection electrode 21 including "N" gas injection orifices, each gas injection plenum can be coupled to "N/3" gas injection orifices and, more generally, if "M" injection plenums (and M corresponding gas valves 27) were employed, each region can be coupled to N/M gas injection orifices. However, the number of gas injection plenums and gas injection orifices is not limited in any way by these exemplary embodiments.

When gas valve(s) 27A, 27B, 27C is/are open, process gas flows to the respective gas injection plenum(s) 23A, 23B, 23C, and process gas is introduced to the process chamber via at least one region of gas injection orifices 24A, 24B, 24C. When gas valve(s) 27A, 27B, 27C is/are closed, process gas does not flow to the respective gas injection plenum(s) 23A, 23B, 23C, and process gas is not introduced to the process chamber via one of the regions of gas injection orifices 24A, 24B, 24C. In a preferred embodiment, the timing for gas valves 27A, 27B, 27C opening and closing and the sequencing of gas valves are utilized to affect process conditions suitable for improved materials processing applications.

Controller 90 includes a microprocessor, memory, and a digital I/O port capable of generating control voltages sufficient to activate valves 27A, 27B, 27C as well as mass flow controllers 32A, 32B, 32C, 32D. Moreover, controller 90 exchanges status data with the gas supply 34. In addition, controller 90 sends and receives control signals to and from vacuum pump 55. For example, a gate valve can be controlled. A program stored in the memory includes a process recipe with which to activate the valves and the respective gas flow rate when desired. One example of controller 90 is a Model #SBC2486DX PC/104 Embeddable Computer Board commercially available from Micro/sys, Inc., 3730 Park Place, Glendale, Calif. 91020.

In a second embodiment shown in FIG. 2, plasma processing device 100 includes the same components as described in reference to FIG. 1 except for several elements as part of the gas injection system 120 to be described below. The same reference numerals will be used to identify identical components present in both the first embodiment and the second embodiment. As described in FIG. 1 and again shown in FIG. 2, the process gas arriving at entrance to valve manifold 26 is distributed to different regions within gas injection electrode 21 via gas valves 27A, 27B, 27C. Each valve 27A, 27B, 27C is independently coupled to a separate gas line 38, 138 and 238, respectively. Each gas line 38, 138, 238 is connected to an independent mass flow controller manifold 30, 130, 230 and gas supply 34, 134, 234, respectively.

Process gas carried in gas line 38 originates from gas supply 34. For example, gas supply 34 can be a cabinet that houses a plurality of compressed gas cylinders, each of which stores a gas. The flow rate of processing gas is monitored and controlled via mass flow controllers 32A, 32B, 32C, 32D, which are assembled as mass flow controller manifold 30.

Similarly, process gas carried in gas line 138 originates from gas supply 134. For example, gas supply 134 can be a cabinet that houses a plurality of compressed gas cylinders, each of which stores a gas. The flow rate of processing gas is monitored and controlled via mass flow controllers 132A, 132B, 132C, 132D, which are assembled as mass flow controller manifold 130.

Process gas carried in gas line 238 originates from gas supply 234. For example, gas supply 234 can be a cabinet that houses a plurality of compressed gas cylinders, each of which stores a gas. The flow rate of processing gas is monitored and controlled via mass flow controllers 232A, 232B, 232C, 232D assembled as mass flow controller manifold 230.

Controller 90 includes a microprocessor, memory, and a digital I/O port capable of generating control voltages sufficient to activate valves 27A, 27B, 27C, as well as mass flow controllers 32, 132 and 232. Moreover, controller 90 exchanges status data with the gas supplies 34, 134 and 234. In addition, controller 90 sends and receives control signals to and from vacuum pump 55 controller. For example, a gate valve can be controlled. A program stored in the memory includes a process recipe with which to activate the valves and the respective gas flow rate when desired. One example of controller 90 is a Model #SBC2486DX PC/104 Embeddable Computer Board commercially available from Micro/sys, Inc., 3730 Park Place, Glendale, Calif. 91020.

In an alternate embodiment, gas injection electrode 21 includes heating/cooling and electrical systems in order to serve as a RF powered electrode. Similar to the chuck electrode 40, the (upper) gas injection electrode is energized via application of RF power from a RF generator (not shown) through an impedance match network (not shown) and coaxial transmission line (not shown). Gas injection electrode 22 is conventionally configured to serve as an electrode through which RF power (e.g. 2 to 3 kW of 60 MHz RF power) is coupled to sustain plasma 60. The powered electrode is electrically insulated from the grounded chamber wall.

In a further alternative embodiment, gas injection electrode 21 further includes a gas inject plate (not shown) attached to the lower surface 22 of gas injection electrode 21. The gas inject plate can be machined from a metal such as aluminum and, for those surfaces in contact with the plasma, anodized to form an aluminum oxide protective coating or spray coated with $Y_2O_3$. Furthermore, the gas inject plate may be fabricated from silicon or carbon to act as a scavenging plate, or it can be fabricated from silicon carbide to promote greater erosion resistance. The gas inject plate includes gas orifices substantially aligned with those orifices extending through bottom surface 22 of gas injection electrode 21.

Vacuum pump 55 is preferably a turbo-molecular vacuum pump (TMP) capable of a pumping speed up to 5000 liters per second or greater. In conventional plasma processing devices utilized for dry plasma etch, a 1000 to 3000 liter per second TMP is employed. TMPs are useful for low pressure processing, typically less than 50 mTorr. At higher pressures, the TMP pumping speed falls off dramatically. For high pressure processing (e.g., processing greater than 100 mTorr), a mechanical booster pump and dry roughing pump is recommended.

Figure 2:
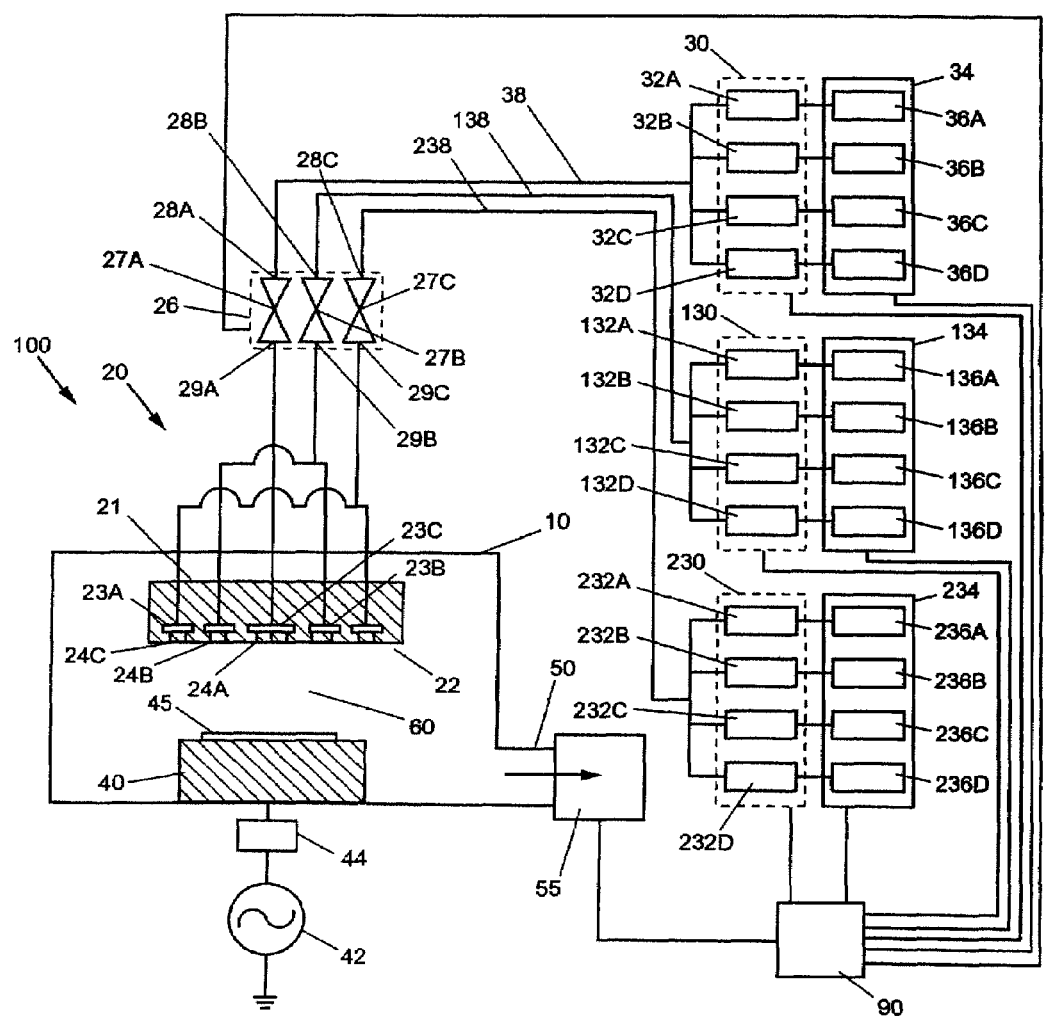
FIG. 2 is a schematic view of a plasma processing device with a gas injection system according to a second embodiment of the present invention.
Figure 3:
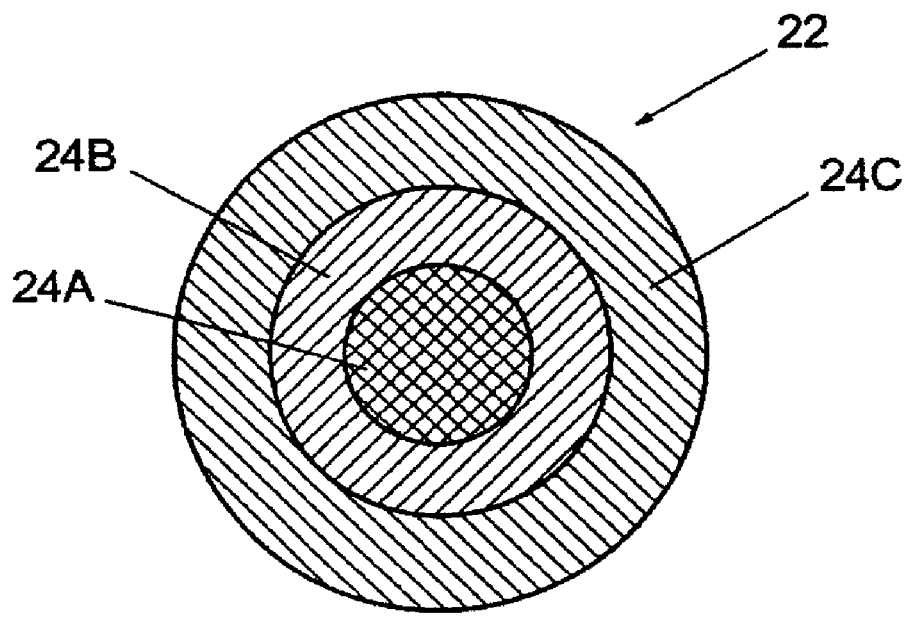
FIG. 3 is a plan view of a first gas injection zoning pattern according to the embodiments of FIGS. 1 and 2.
Figure 4:
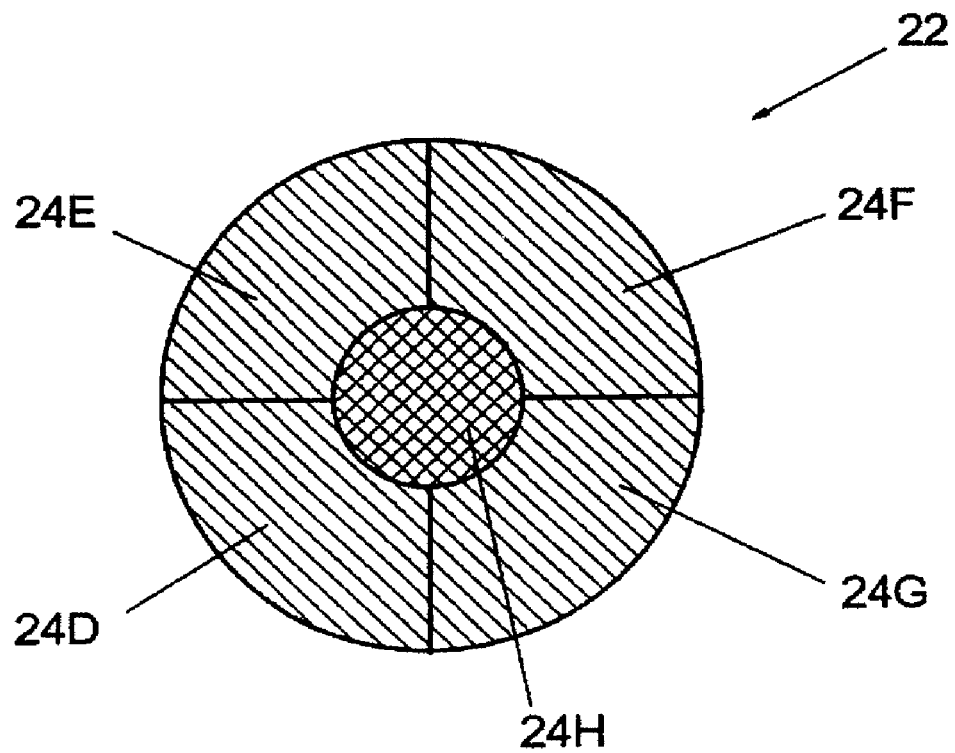
FIG. 4 is a plan view of a second gas injection zoning pattern according to the embodiments of FIGS. 1 and 2.

In FIGS. 1 and 2, the regions of gas injection orifices 24A, 24B, 24C are associated with gas injection plenums 23A, 23B, 23C such that the pattern created forms annular rings. A plan view of this configuration is presented in FIG. 3. The pattern described in FIG. 3 enables radial control of the gas flow rate above substrate 45. However, other configurations are possible including the five zone gas injection system of FIG. 4 including zones 24D, 24E, 24F, 24G, 24H. The pattern described in FIG. 4 further enables azimuth control of the gas flow rate above substrate 45. In FIGS. 3 and 4, three zones 24A, 24B, 24C, and five zones 24D, 24E, 24F, 24G, 24H are shown; however, the number of zones and their pattern is not limited. And more generally, the volume of space defining each plenum 23A, 23B, 23C is a simply connected or non-simply connected domain.

In order to facilitate changes in the neutral gas transport local to the surface of substrate 45, process gas injection is oriented such that the flow of gas is substantially normal to the surface of substrate 45. Therefore, the lower surface 22 of gas injection electrode system 21 is substantially parallel with the surface of substrate 45. Moreover, the gas injection should be made proximate the substrate surface 45; for example, directly above the surface of substrate 45.

With continuing reference to FIGS. 1 and 2, regions of gas injection orifices 24A, 24B, 24C each include a plurality of gas injection orifices. Three exemplary orifice cross-sections are depicted in FIGS. 5-7.

Figure 5:
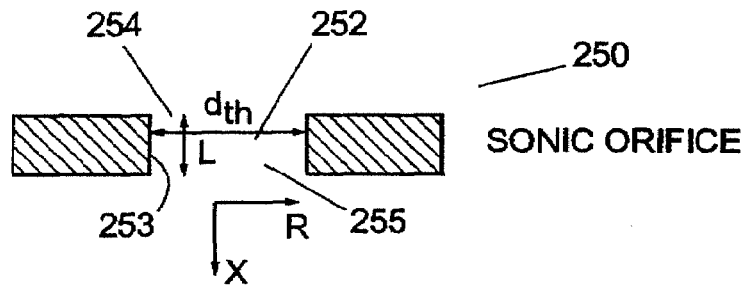
FIG. 5 is a cross-sectional view of an individual gas injection orifice, illustrating a first geometry.

In FIG. 5, a cross-sectional schematic of a preferred gas injection orifice 250 is shown, including an orifice throat 252 substantially cylindrical in cross-section with length L and diameter $d_{th}$ and having inner cylindrical wall 253. The orifice throat 252 is defined as the minimum area cross-section. A typical range for length L is between 0.025 mm and 20 mm and diameter $d_{th}$ is between 0.025 mm and 2 mm. The inlet 254 to cylindrical orifice 252 has a cross-section substantially similar to the outlet 255.

Figure 6:
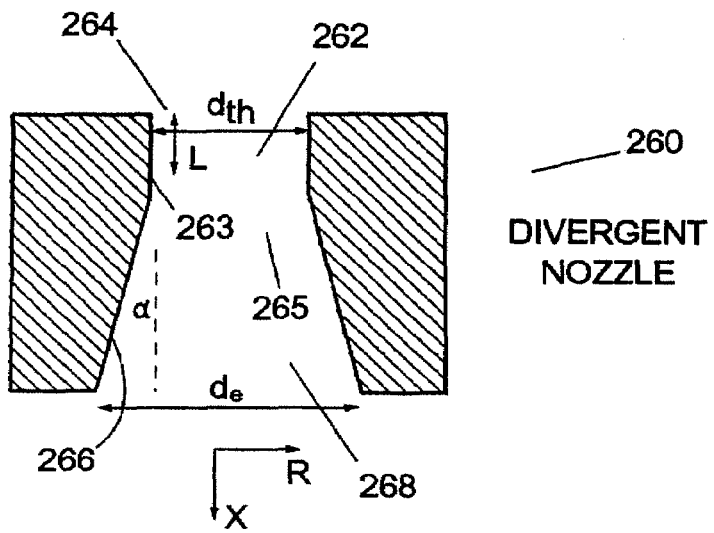
FIG. 6 is a cross-sectional view of an individual gas injection orifice, illustrating a second geometry.

In a second configuration presented in FIG. 6, the gas injection orifice 260 includes a first section substantially cylindrical in cross-section having an orifice throat 262 with inlet 264, outlet 265 and inner cylindrical wall 263. Beyond the orifice throat 262 extends a substantially divergent section with inlet 265, inner conical wall 266 and outlet 268 of diameter $d_e$, wherein diameter $d_e$ is greater than or equal to the throat diameter $d_{th}$. This geometry is referred to as a divergent nozzle. Preferably, the half-angle α of the conically divergent section wall 266 does not exceed eighteen degrees in order to minimize radial flow losses within the divergent nozzle, and more preferably, the angle α is between twelve degrees and eighteen degrees.

Figure 7:
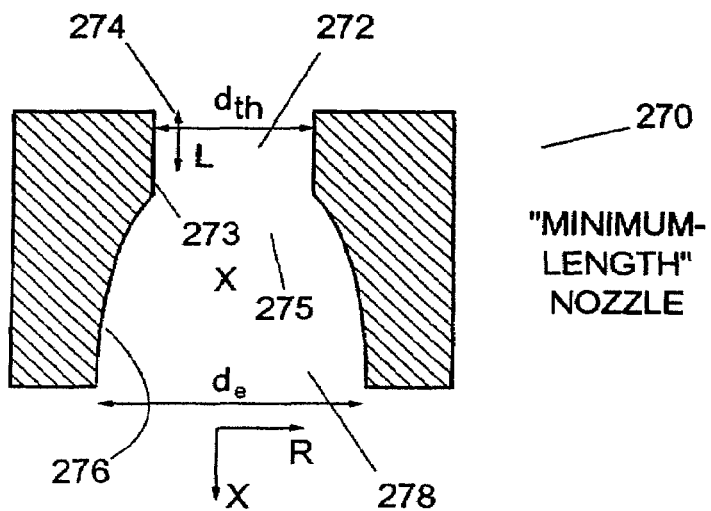

In a third configuration presented in FIG. 7, the gas injection orifice 270 includes a first section substantially cylindrical in cross-section having an orifice throat 272 with inlet 274, outlet 275 and inner cylindrical wall 273. Beyond the orifice throat 272 extends a substantially divergent section with inlet 275, inner concave wall 280 and outlet 278 of diameter $d_e$, wherein diameter $d_e$ is greater than or equal to the throat diameter $d_{th}$. This geometry is referred to as a "minimum-length" nozzle; a simplified version of a "perfect" nozzle. An example of a perfect nozzle is shown in FIG. 7A. Minimum-length and perfect nozzles are well known to those skilled in the art. The latter two configurations may serve to restrain the rate of expansion of process gas from the total pressure in the gas injection plenums 23A, 23B, 23C to the process chamber pressure, if configured properly using the Method of Characteristics. The Method of Characteristics is a well-known method used to design a divergent nozzle and, more specifically, it is used to tailor the divergent nozzle shape (particularly those divergent nozzles with a non-zero second derivative of the wall coordinate) to avoid nozzle shock losses. The use of the Method of Characteristics can lead to what are known as "perfect" and "minimum-length" nozzles. This method and such nozzles are well known to one of ordinary skill in the art.

Utilizing the embodiments shown in FIGS. 1 and 2, the present invention describes a method to cyclically sequence the process gas flow through regions of gas injection orifices 24A, 24B, 24C (as shown in FIGS. 1 and 2) in order to increase the gas injection total pressure while satisfying an upper limit to the process gas flow rate, achieving gas flow uniformity during a sequence cycle and employing practical orifice configurations. For example, gas injection electrode 21 can include M regions of gas injection orifices 250, wherein gas injection electrode 21 includes a total number of N gas injection orifices 250 and each region includes a fraction of the total number of gas injection orifices 250 in gas injection electrode 21. Preferably, the fraction of the total number of gas injection orifices 250 is N/M. In this system, the gas injection total pressure is approximately M times greater in each gas injection plenum 23A, 23B, 23C than the total pressure in a single gas injection plenum coupled to all N gas injection orifices 250.

Figure 8:
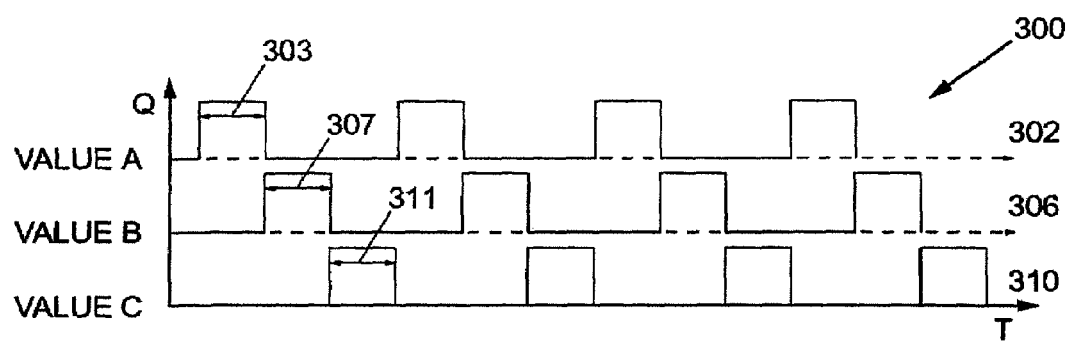
FIG. 8 illustrates a first timing diagram for gas injection sequencing in accordance with an embodiment of the present invention.

FIG. 8 illustrates a preferred first timing diagram 300 for gas injection sequencing using a gas sequencing method wherein the process gas flow is cyclically sequenced, for simplicity, between regions of gas injection orifices 24A, 24B, 24C. A first valve 27A, pneumatically connected to a first region of gas injection orifices 24A follows sequence 302. A second valve 27B, coupled to a second region of gas injection orifices 24B follows sequence 306. And, a third valve 27C, coupled to a third region of gas injection orifices 24C follows sequence 310. Gas injection sequencing proceeds when; in sequence 302, valve 27A opens for a time ($t_1$) 303, flows process gas at a gas flow rate $Q_1$ through a region of total flow-through area of $A_1$ and then closes; in sequence 306, gas valve 27B opens for a time ($t_2$) 307, flows process gas at a gas flow rate $Q_2$ through a region of total flow-through area of $A_2$ and closes; and, in sequence 310, gas valve 27C opens for a time ($t_3$) 311, flows process gas at a gas flow rate $Q_3$ through a region of total flow-through area of $A_3$ and closes. The three sequences are repeated throughout the duration of a substrate processing time T.

In the preferred method, the gas injection sequencing is such that the gas flow rate is substantially steady (or stationary) during the substrate processing time, viz.

$$Q_1=Q_2=Q_3=Q,$$

where Q is a substantially steady process gas flow rate, as opposed to gas injection pulsing where the gas flow rate is unsteady (or non-stationary) during the substrate processing time. During the gas sequencing, process gas is injected locally above the substrate according to the activated region of gas injection orifices.

In an alternate embodiment, the gas injection sequencing is such that the gas mass flux is substantially steady (or stationary) during the substrate processing time, viz.

$$Q_1*t_1/A_1=Q_2*t_2/A_2=Q_3*t_3/A_3=Q*T/A_{tot},$$

where $A_{tot}$ is the sum of the region total flow-through area for all regions of gas injection orifices 24A, 24B and 24C; i.e. $A_{tot}=A_1+A_2+A_3$.

In an alternate method, the period of time where each region of gas injection orifices is activated, i.e. 303, 307 and 311, can be adjusted to optimize the spatial uniformity of the materials process. Typically, the sequence times 303, 307 and 311 vary between one to five seconds.

Figure 9:
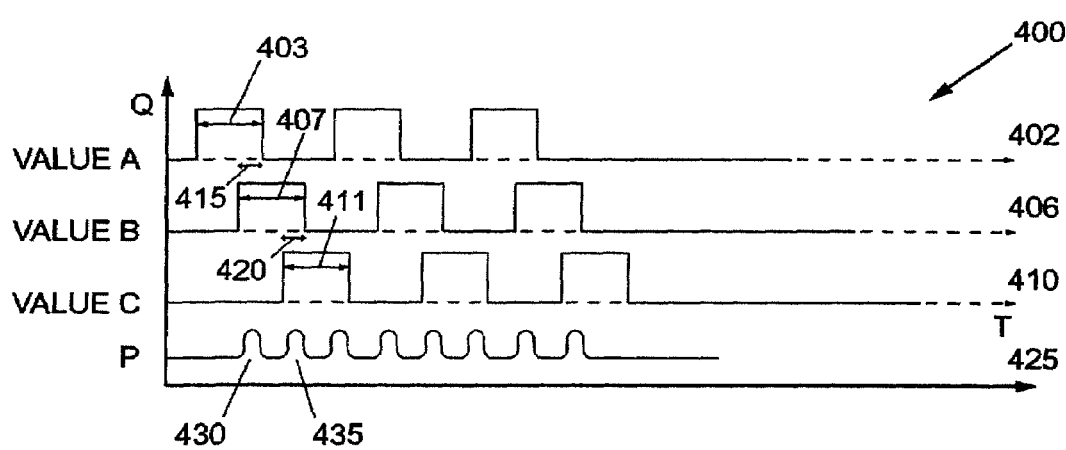
FIG. 9 illustrates a second timing diagram for gas injection sequencing in accordance with an embodiment of the present invention.

FIG. 9 presents an alternate timing diagram 400 for gas injection sequencing using an alternative gas sequencing method wherein the process gas flow is cyclically sequenced between regions of gas injection orifices 24A, 24B, 24C; however, the gas sequences are overlapped. A first valve 27A, coupled to a first region of gas injection orifices 24A follows sequence 402. A second valve 27B, pneumatically connected to a second region of gas injection orifices 24B follows sequence 406. And, a third valve 27C, pneumatically connected to a third region of gas injection orifices 24C follows sequence 410.

Gas injection sequencing proceeds when; in sequence 402, valve 27A opens for a time ($t_1$) 403, flows process gas at a gas flow rate $Q_1$ through a region of total flow-through area of $A_1$ and closes; in sequence 406, gas valve 27B opens for a time ($t_2$) 407, flows process gas at a gas flow rate $Q_2$ through a region of total flow-through area of $A_2$ and closes wherein the beginning of time period 407 of sequence 406 overlap with end of time period 403 in sequence 402 for a time period 415; and, in sequence 410, gas valve 27C opens for a time ($t_3$) 311, flows process gas at a gas flow rate $Q_3$ through a region of total flow-through area of $A_3$ and closes wherein the beginning of time period 411 of sequence 410 overlaps with end of time period 407 in sequence 406 for a time period 420. The three sequences are repeated throughout the duration of the substrate processing time T.

During the gas sequencing, process gas is injected locally above the substrate according to the activated region of gas injection orifices. In an alternate method, the period of time where each region of gas injection orifices is activated, i.e. 403, 407 and 411, may be adjusted to optimize the spatial uniformity of the materials process according to substrate processing results. However, in addition to the set of control parameters available for the first gas injection sequencing scheme 300, the second gas injection sequencing scheme offers the ability to modulate the chamber pressure according to the signal 425 in FIG. 9 wherein the pressure "modulation" has time periods 430 and 435 mirroring the occurrence of valve sequence overlaps 415 and 420, respectively.

In order to facilitate the chamber pressure modulation, the gate valve used in conjunction with vacuum pump 55 must remain stationary (i.e. it must not adjust itself in response to the pressure variations). These pressure "modulations" can further affect the neutral transport local to the upper surface of substrate 45. The system will behave as depicted in FIG. 9 when the time periods 430 and 435 are sufficiently small relative to the sequence time periods 403, 407 and 411. Typically, the sequence times 403, 407 and 411 vary between 1 to 5 seconds and the overlap time periods vary between 0.1 to 1 second.

Figure 10:
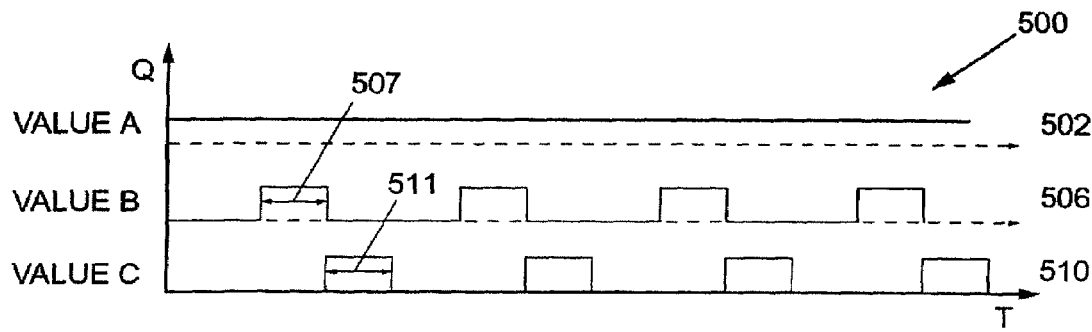
FIG. 10 illustrates a third timing diagram for gas injection sequencing in accordance with an embodiment of the present invention.

FIG. 10 presents an alternate timing diagram 500 for gas injection sequencing using an alternative gas sequencing method wherein the process gas flow is cyclically sequenced between regions of gas injection orifices 24A, 24B, 24C. A first valve 27A, coupled to a first region of gas injection orifices 24A remains open during processing according to sequence 502. A second valve 27B, coupled to a second region of gas injection orifices 24B follows sequence 506. And, a third valve 27C, coupled to a third region of gas injection orifices 24C follows sequence 510.

Gas injection sequencing proceeds when; in sequence 502, valve 27A remains open during processing for time T and flows process gas at a gas flow rate of $Q_1$ through a region of total flow-through area of $A_1$; in sequence 506, gas valve 27B opens for a time ($t_2$) 507, flows process gas at gas flow rate of $Q_2$ through a region of total flow-through area of $A_2$ and closes; and, in sequence 510, gas valve 27C opens for a time ($t_3$) 511, flows process gas at a gas flow rate of $Q_3$ through a region of total flow-through area $A_3$ and closes. The three sequences are repeated throughout the duration of the substrate processing time T. During the gas sequencing, process gas is injected locally above the substrate according to the activated region of gas injection orifices. Moreover, the period of time where each region of gas injection orifices is activated, i.e. 507 and 511, may be adjusted to optimize the spatial uniformity of the materials process. Typically, the sequence times 507 and 511 vary between one to five seconds.

Although three specific gas sequencing diagrams 300, 400 and 500 and methods have been presented with reference to FIGS. 8, 9 and 10, it will be appreciated by those skilled in the art that other alternatives are possible including combinations thereof.

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

The invention claimed is:

1. A method for supplying at least one process gas to a plasma processing device using a gas injection system including a plurality of regions into which all gas injection orifices of the gas injection system are divided, the method comprising:

sequentially starting and stopping at different periods of time the at least one process gas within a process chamber of the plasma processing device at each of the plurality of regions relative to the other of the plurality of regions, the sequentially starting and stopping including cyclically providing at a first gas flow rate the at least one process gas for a first period of time within the plasma processing device at a first region of the gas injection system;

cyclically providing at a second gas flow rate the at least one process gas for a second period of time within the plasma processing device at a second region of the gas injection system; and performing the cyclically providing at the first gas flow rate and the cyclically providing at the second gas flow rate for a third period of time, wherein the first period of time partially overlaps the second period of time during an overlap period ranging between 0.1 and 1 second;

controlling total gas flow rate of the at least one process gas to the plasma processing device to rise during the overlap period and fall to a substantially steady level outside of the overlap period.

2. The method according to claim 1, wherein a first process gas is provided in the cyclically providing at the first gas flow rate and a second process gas is provided in the cyclically providing at the second gas flow rate, the first process gas being different from the second process gas.

3. The method according to claim 1, further comprising:

cyclically providing at a third gas flow rate the at least one process gas for a fourth period of time within the plasma processing device at a third region of the gas injection system; and performing the cyclically providing at a third gas flow rate for the third period of time.

4. The method according to claim 3, wherein a first process gas is provided in the cyclically providing at the first gas flow rate, a second process gas is provided in the cyclically providing at the second gas flow rate, a third process gas is provided in the cyclically providing at a third gas flow rate, and the first process gas, the second process gas and the third process gas are different from each other.

5. The method according to claim 1, wherein the first period of time and the second period of time range between 1 and 5 seconds.

6. The method according to claim 1, further comprising:

modulating total gas injection pressure in the plasma processing device to cyclically increase during the third period of time.

* * * * *